(12) United States Patent
Kanno et al.

(10) Patent No.: US 12,027,818 B2
(45) Date of Patent: Jul. 2, 2024

(54) SEMICONDUCTOR LASER (71) Applicant: Nippon Telegraph and Telephone Corporation, Tokyo (JP)

(72) Inventors: Erina Kanno, Tokyo (JP); Koji Takeda, Tokyo (JP); Takaaki Kakitsuka, Tokyo (JP); Shinji Matsuo, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 820 days.

(21) Appl. No.: 17/057,037

(22) PCT Filed: May 9, 2019

(86) PCT No.: PCT/JP2019/018526
§ 371 (c)(1),
(2) Date: Nov. 19, 2020

(87) PCT Pub. No.: WO2019/225331
PCT Pub. Date: Nov. 28, 2019

(65) Prior Publication Data
US 2021/0126430 A1    Apr. 29, 2021

(30) Foreign Application Priority Data

May 21, 2018 (JP) ................................. 2018-096890

(51) Int. Cl.
*H01S 5/12* (2021.01)
*H01S 5/125* (2006.01)
(52) U.S. Cl.
CPC ................ *H01S 5/125* (2013.01); *H01S 5/12* (2013.01); *H01S 5/1237* (2013.01)

(58) Field of Classification Search
CPC .......... H01S 5/125; H01S 5/12; H01S 5/1237; H01S 5/1014; H01S 5/1039; H01S 5/2275; H01S 5/3214; H01S 5/124; H01S 5/021
See application file for complete search history.

(56) References Cited

U.S. PATENT DOCUMENTS

| | | | | |
|---|---|---|---|---|
| 5,808,314 A | * | 9/1998 | Nakajima | H04B 10/50 257/85 |
| 6,594,295 B1 | * | 7/2003 | Sargent | B82Y 20/00 372/45.01 |

(Continued)

FOREIGN PATENT DOCUMENTS

| | | |
|---|---|---|
| JP | H1056231 A | 2/1998 |
| JP | 2002223032 A | 8/2002 |

(Continued)

OTHER PUBLICATIONS

Ohira, Kazuya et al., "GaInAsP/InP distributed reflector laser with phase-shifted DFB and quantum-wire DBR sections", IEICE Electronics Express, vol. 2, No. 11, Jun. 10, 2005, pp. 356-361.

(Continued)

*Primary Examiner* — Xinning(Tom) Niu
(74) *Attorney, Agent, or Firm* — Slater Matsil, LLP (57) ABSTRACT

A semiconductor laser includes a distributed feedback active region and two distribution Bragg reflecting mirror regions which are arranged to be continuous with the distributed feedback active region. The distributed feedback active region has an active layer which is composed of a compound semiconductor and a first diffraction grating. The first diffraction grating is composed of a recessed portion which is formed to extend through a diffraction grating layer formed on the active layer and a projection portion which is adjacent to the recessed portion.

10 Claims, 5 Drawing Sheets (56) References Cited

U.S. PATENT DOCUMENTS

2005/0031002 A1* 2/2005 Botez ................ H01S 5/125
 372/96
2015/0255947 A1* 9/2015 Kitamura ............ G02B 5/1852
 359/571

FOREIGN PATENT DOCUMENTS

| JP | 2007299791 A | | 11/2007 |
|----|--------------|---|---------|
| JP | 20186440 A | | 1/2018 |
| JP | 2018006440 A | * | 1/2018 |

OTHER PUBLICATIONS

Otsubo, K., et al., "Low-Driving-Current High-Speed Direct Modulation up to 40 GB/s Using 1.3 μm Semi-Insulating Buried-Heterostructure AIGaInAs-MQW Distributed Reflector (DR) Lasers", OSA/OFC/NFOEC, OThT6.pdf, otsubo.koji@jp.fujitsu.com, Mar. 22-26, 2009, 3 pages.

Utaka, Katsuyuki et al., "λ/4-Shifted InGaAsP/InP DFB Lasers", IEEE Journal of Quantum Electronics, vol. QE-22, No. 7, Jul. 1986, 10 pages.

* cited by examiner

Fig. 9

SEMICONDUCTOR LASER

CROSS-REFERENCE TO RELATED APPLICATIONS

This application is a national phase entry of PCT Application No. PCT/JP2019/018526, filed on May 9, 2019, which claims priority to Japanese Application No. 2018-096890, filed on May 21, 2018, which applications are hereby incorporated herein by reference.

TECHNICAL FIELD

The present invention relates to a semiconductor laser which is used in an optical transmitter light source or the like.

BACKGROUND

Various wavelength multiplexing light sources are currently being developed in response to demand for increase in speed and capacity of optical fiber communications based on wavelength division multiplexing (WDM). Control of a lasing wavelength of a laser as a light source and the like are important to realize the demand. Examples of a related technique include a distributed feedback (DFB) laser (see Non-Patent Literature 1).

A DFB laser is a laser including a diffraction grating on an active layer, and a lasing wavelength of the DFB laser is determined by a pitch and a depth of the diffraction grating. The laser has a waveguide structure, and oscillation light is emitted from two ends of the waveguide structure. Thus, if the laser is integrated with a ring filter or the like, light emitted from one end portion is not used, and half of the light is lost.

To solve the above-described problem, there is proposed a distributed reflector (DR) laser configured such that a high-reflectivity distribution Bragg reflection (Distribution Bragg Reflector, DBR) is connected to one end portion of a DFB laser to emit light from the other end portion (see Non-Patent Literature 2).

There is also proposed a DR laser in which respective DBRs are provided at two end portions of a DFB laser, reflectivity of the other DBR is set lower than that of one DBR, and light is emitted from the other DBR (see Non-Patent Literature 3). As compared with a configuration with a DBR only on one side, a configuration with DBRs on two sides can reduce a lasing threshold gain and has an advantage to oscillate a short-cavity laser with a high loss.

CITATION LIST

Non-Patent Literature

Non-Patent Literature 1: K. Utaka et al., "λ/4-Shifted InGaAsP/InP DFB Lasers," IEEE Journal of Quantum Electrons, Vol. QE-22, No. 7, pp. 1042, 1986
Non-Patent Literature 2: K. Ohira et al., "GaInAsP/InP distributed reflector laser with phase-shifted DFB and quantum-wire DBR sections," IEEE Electronic Express, Vol. 2, No. 11, pp. 356, 2005
Non-Patent Literature 3: K. Otsubo et al., "Low-Driving-Current High-Speed Direct Modulation up to 40 Gb/s Using 1.3-μm Semi-Insulating Buried-Heterostructure AlGaInAs-MQW Distributed Reflector (DR) Lasers," OSA/OFC/NFOEC, OThT6, 2009

SUMMARY

Technical Problem

Although WDM using a DFB laser as a wavelength multiplexing light source is introduced to a metro network at present, attempts to introduce WDM to optical interconnect for short-distance communication between, e.g., chips are under consideration. Since a chip-to-chip optical interconnect needs a laser with low power consumption and short active layer length, a two-sided DR laser capable of reducing a lasing threshold gain is more suitable than a DFB laser and a one-sided DR laser. To further increase a density of wavelength multiplexing using a DFB laser, a one-sided DR laser, and a two-sided DR laser, more accurate lasing wavelength control is needed.

However, a conventional technique suffers from the problem of difficulty in accurate control of a lasing wavelength, as illustrated below. Conventionally, a diffraction grating is generally formed by forming recesses and projections with a predetermined period through etching of a compound semiconductor, such as InP, of which a region including an active layer and the like is composed, using a predetermined mask pattern. For this reason, control of a depth of the diffraction grating is determined by an etching amount.

As is well known, accurate control of an etching amount, however, is not easy. Since a lasing wavelength is determined by a coupling coefficient of a diffraction grating, and the coupling coefficient of the diffraction grating depends on a depth of the diffraction grating, accurate control of the depth of the diffraction grating determined by an etching amount as described above is not easy.

An embodiment of the present invention has been made to solve the above-described problems, and has as its object to allow easier accurate control of a lasing wavelength.

Means for Solving the Problem

A semiconductor laser according to embodiments of the present invention includes a distributed feedback active region which has an active layer formed on a substrate and made of a compound semiconductor and a first diffraction grating, and two distribution Bragg reflecting mirror regions which have two core layers formed across the active layer from each other in a wave-guiding direction to be continuous with the active layer and made of a compound semiconductor and second diffraction gratings formed to correspond to the respective core layers and are arranged across the distributed feedback active region from each other in the wave-guiding direction to be continuous with the distributed feedback active region. The first diffraction grating is composed of a recessed portion which is formed to extend through a diffraction grating layer formed on the active layer and a projection portion which is adjacent to the recessed portion, and the diffraction grating layer is composed of a material which is more resistant to etching than a constituent material for the distributed feedback active region.

In the above-described semiconductor layer, the diffraction grating layer is composed of a material with a lower refractive index than a refractive index of the constituent material for the distributed feedback active region.

In the above-described semiconductor layer, the first diffraction grating may be formed lateral to the active layer, and the second diffraction gratings may be formed lateral to the core layers.

In the above-described semiconductor layer, the diffraction grating layer may be composed of a dielectric substance.

Effects of Embodiments of the Invention

As has been described above, an embodiment of the present invention achieves an excellent effect, i.e., allows easier accurate control of a lasing wavelength.

DETAILED DESCRIPTION OF ILLUSTRATIVE EMBODIMENTS

Semiconductor lasers according to embodiments of the present invention will be described below.

First Embodiment

Figure 1:
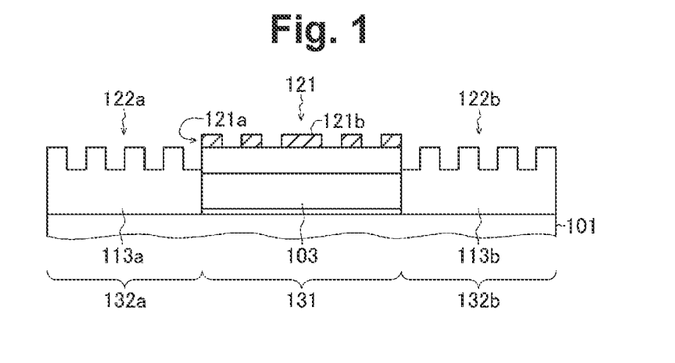
FIG. 1 is a cross-sectional view showing a configuration of a semiconductor laser according to a first embodiment of the present invention.

A semiconductor laser according to a first embodiment of the present invention will be described with reference to FIG. 1.

The semiconductor laser includes a distributed feedback active region 131 and two distribution Bragg reflecting mirror regions 132a and 132b which are arranged to be continuous with the distributed feedback active region 131. The semiconductor laser is a so-called DR laser. The distribution Bragg reflecting mirror regions 132a and 132b are arranged across the distributed feedback active region 131 from each other in a wave-guiding direction to be continuous with the distributed feedback active region 131.

The distributed feedback active region 131 has an active layer 103 which is made of a compound semiconductor and a first diffraction grating 121. The distribution Bragg reflecting mirror regions 132a and 132b have two core layers 113a and 113b which are made of a compound semiconductor and second diffraction gratings 122a and 122b which are formed to correspond to the respective core layers 113a and 113b. The core layers 113a and 113b are formed across the active layer 103 from each other in the wave-guiding direction to be continuous with the active layer 103.

The first diffraction grating 121 is composed of recessed portions which are formed to extend through a diffraction grating layer 121a which is formed on the active layer 103 and projection portions which are adjacent to the recessed portions. Note that, in the first embodiment, the second diffraction gratings 122a and 122b are formed by, e.g., patterning upper surfaces of the core layers 113a and 113b by a publicly known lithographic technique and a publicly known etching technique.

The diffraction grating layer 121a is composed of a material which is more resistant to etching than a constituent material for the distributed feedback active region 131. The diffraction grating layer 121a may be composed of a material with a lower refractive index than that of the constituent material for the distributed feedback active region 131. For example, the diffraction grating layer 121a may be composed of a dielectric substance, such as SiN, $SiO_xN_y$, $SiO_2$, $Al_2O_3$, or $HfO_2$.

Note that, in the semiconductor laser according to the first embodiment, the first diffraction grating 121 includes a phase shift unit (λ/4 shift) 121b. The phase shift unit 121b is set such that a Bragg wavelength of the first diffraction grating 121 is uniform.

The semiconductor laser according to the first embodiment is, for example, set such that coupling coefficients of the second diffraction gratings 122a and 122b are higher than that of the first diffraction grating 121. For example, the above-described coupling coefficient relationship can be established by making a level difference between recesses and projections of each of the second diffraction gratings 122a and 122b larger than a level difference between recesses and projections of the first diffraction grating 121. Note that the phase shift unit 121b is arranged in a central unit of the first diffraction grating 121 in the first embodiment.

Figure 2A:
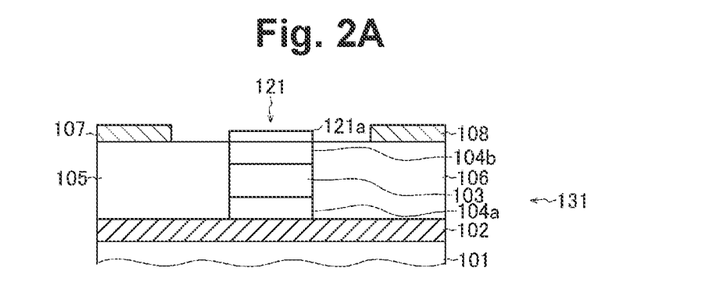
FIG. 2A is a cross-sectional view showing a configuration of a portion of the semiconductor laser according to the first embodiment of the present invention.
Figure 2B:
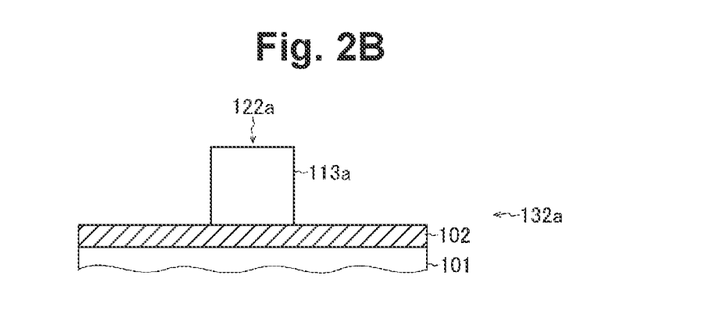
FIG. 2B is a cross-sectional view showing a configuration of a portion of the semiconductor laser according to the first embodiment of the present invention.

A more specific description will be given below with reference to FIGS. 2A and 2B. The distributed feedback active region 131 and the distribution Bragg reflecting mirror regions 132a and 132b are formed on the same substrate 101. The distributed feedback active region 131 includes an n-type semiconductor layer 105 and a p-type semiconductor layer 106 which are formed in contact with the active layer 103. In this example, the n-type semiconductor layer 105 and the p-type semiconductor layer 106 are arranged in a planar direction of the substrate 101 and are formed in contact with side surfaces of the active layer 103.

The distributed feedback active region 131 also includes an n-type electrode 107 which is electrically connected to the n-type semiconductor layer 105 and a p-type electrode 108 which is electrically connected to the p-type semiconductor layer 106. In this example, current is injected in the planar direction (a lateral direction) of the substrate 101. Note that the n-type electrode 107 may be formed above the n-type semiconductor layer 105 with an n-type contact layer between the n-type electrode 107 and the n-type semiconductor layer 105, an n-type impurity being introduced at a higher concentration into the n-type contact layer. Similarly, the p-type electrode 108 may be formed above the p-type semiconductor layer 106 with a p-type contact layer between the p-type electrode 108 and the p-type semiconductor layer 106, a p-type impurity being introduced at a higher concentration into the p-type contact layer.

In the distribution Bragg reflecting mirror region 132a, the core layer 113a is formed to be continuous with the active layer 103. Additionally, in the distribution Bragg reflecting mirror region 132b, the core layer 113b is formed to be continuous with the active layer 103. In this example, the second diffraction grating 122a is formed on the core layer 113a, and the second diffraction grating 122b is formed on the core layer 113b.

Note that, a lower cladding layer 102 is formed on the substrate 101, and the active layer 103 is formed above the lower cladding layer 102. The core layers 113a and 113b are also formed on the lower cladding layer 102. The active layer 103 is sandwiched between a semiconductor layer 104a and a semiconductor layer 104b in a vertical direction, as viewed from the substrate 101. A laminated structure of the semiconductor layer 104a, the active layer 103, and the semiconductor layer 104b is sandwiched between the n-type semiconductor layer 105 and the p-type semiconductor layer 106. The p-type semiconductor layer 106 and the n-type semiconductor layer 105 are formed across the active layer 103 from each other in a direction parallel to a flat surface of the substrate 101.

Here, the active layer 103 is formed on and in contact with the semiconductor layer 104a, and the semiconductor layer 104b is formed on and in contact with the active layer 103. The n-type semiconductor layer 105 and the p-type semiconductor layer 106 are formed in contact with side units of the laminated structure of the semiconductor layer 104a, the active layer 103, and the semiconductor layer 104b. Note that the n-type semiconductor layer 105 and the p-type semiconductor layer 106 are not formed in the distribution Bragg reflecting mirror region 132a.

In the distributed feedback active region 131 according to the embodiment, current is injected into the active layer 103 in the direction parallel to the flat surface of the substrate 101. Note that the n-type electrode 107 and the p-type electrode 108 are not formed in the distribution Bragg reflecting mirror regions 132a and 132b.

The active layer 103 extends over a predetermined length in a light emission direction. In the distributed feedback active region 131 in a direction, in which the active layer 103 extends, the diffraction grating layer 121a is formed above the active layer 103, and the first diffraction grating 121 is formed at the diffraction grating layer 121a. As described earlier, the first diffraction grating 121 is composed of the recessed portions that are formed to extend through the diffraction grating layer 121a and the projection portions that are adjacent to the recessed portions. The core layers 113a and 113b are formed to be continuous with the active layer 103 extending in the above-described manner. The second diffraction grating 122a is formed on the upper surface of the core layer 113a, and the second diffraction grating 122b is formed on the upper surface of the core layer 113b. For example, level differences between recesses and projections of each of the second diffraction gratings 122a and 122b are set larger than level differences between recesses and projections of the first diffraction grating 121.

Although not shown, a non-reflective film is formed on an output end face in the semiconductor laser.

The substrate 101 is composed of, for example, silicon. The lower cladding layer 102 is composed of, for example, silicon oxide ($SiO_2$) and is set to have a thickness of 2 μm. The active layer 103 is, for example, set to have a 150-nm-thick quantum well structure in which well layers made of InGaAsP and barrier layers are alternately stacked. The active layer 103 is set to have a width of about 0.7 μm. A total thickness of the semiconductor layer 104a, the active layer 103, and the semiconductor layer 104b is set to 250 nm. Note that the n-type semiconductor layer 105 and the p-type semiconductor layer 106 are each set to have a thickness of 250 nm. A lasing wavelength of the active layer 103 set to have the quantum well structure is 1.55 μm. The diffraction grating layer 121a is composed of SiN, and the first diffraction grating 121 is set to have a Bragg wavelength of 1.55 μm.

The semiconductor layers 104a and 104b are composed of, for example, undoped InP (i-InP). The n-type semiconductor layer 105 that is arranged on one side of the active layer 103 is composed of n-type InP (n-InP) doped with about $1 \times 10^{18}$ $cm^{-3}$ of Si, and the p-type semiconductor layer 106 on the other side is composed of p-type InP (p-InP) doped with about $1 \times 10^{18}$ $cm^{-3}$ of Zn.

The core layers 113a and 113b are composed of undoped InP (i-InP), are set to have a width of about 1.5 μm, and are set to have a thickness of 250 nm. Note that although not shown, the n-type contact layer and the p-type contact layer may be composed of, for example, InGaAs.

The semiconductor laser according to the embodiment is set such that the lower cladding layer 102 made of oxide silicon with a low refractive index is formed underneath InP layers with high refractive indexes and such that air with a low refractive index is present on the InP layers. This results in realization of close confinement of light to the active layer 103, the core layer 113a, and the core layer 113b, which is favorable for laser low-power operation. Since the second diffraction gratings 122a and 122b are formed from the InP layers, an air layer, and large differences in refractive index, a high coupling coefficient above 1000 $cm^{-1}$ can be achieved.

A method for manufacturing the semiconductor laser according to the embodiment will be briefly described below with reference to FIGS. 3A to 3E. FIGS. 3A to 3E are configuration views showing states in the course of manufacture of the semiconductor laser according to the embodiment and schematically show cross-sections taken along a plane parallel to the wave-guiding direction of the distributed feedback active region 131.

Figure 3A:
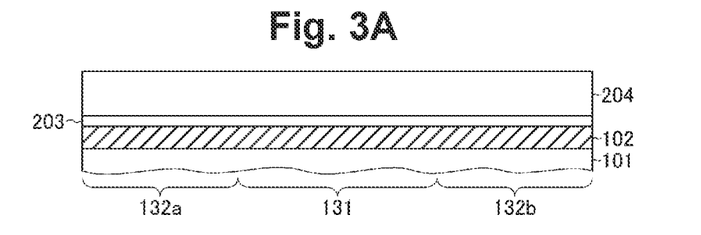
FIG. 3A is a cross-sectional view showing a state in the course of manufacture of the semiconductor laser according to the first embodiment of the present invention.

For example, the substrate (silicon substrate) 101 including the lower cladding layer 102 composed of silicon oxide is first prepared. The lower cladding layer 102 is formed by, for example, thermally oxidizing a principal surface of the substrate 101.

A sacrificing layer which is made of InGaAs, a compound semiconductor layer 203 to serve as the semiconductor layer 104a, a compound semiconductor layer 204 to serve as the active layer 103, and compound semiconductor layers to serve as the core layers 113a and 113b are epitaxially grown on an InP substrate. For example, the layers may be grown by a well-known metalorganic vapor-phase growth method.

A top surface of the epitaxially grown substrate and a surface of the lower cladding layer 102 of the substrate 101 described earlier are directly bonded by a publicly known wafer bonding technique, and the InP substrate and the sacrificing layer are removed after that. As a result, the distributed feedback active region 131 enters a state in which the lower cladding layer 102, the compound semiconductor layer 203, and the compound semiconductor layer 204 are formed on the substrate 101, as shown in FIG. 3A.

Figure 3B:
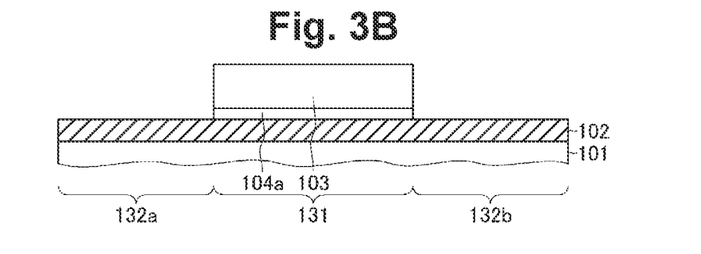
FIG. 3B is a cross-sectional view showing a state in the course of manufacture of the semiconductor laser according to the first embodiment of the present invention.

The compound semiconductor layer 203, the compound semiconductor layer 204, and the like that are grown are patterned by, e.g., wet etching and dry etching using, as a mask, a resist pattern which is produced by a publicly known photolithographic technique to form a stripe structure of the distributed feedback active region 131 which is composed of the semiconductor layer 104a and the active layer 103, as shown in FIG. 3B. Assume that the active layer 103 is absent in each of the distribution Bragg reflecting mirror regions 132a and 132b. Note that the resist pattern is removed after the pattern formation.

Figure 3C:
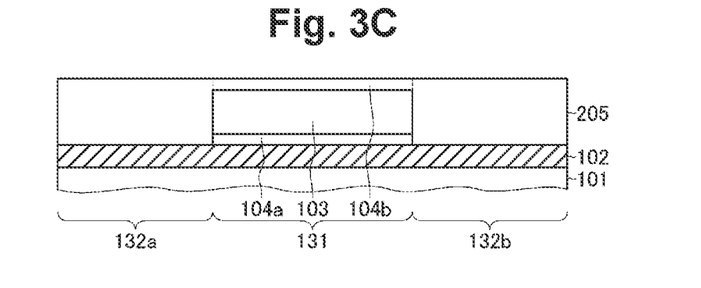
FIG. 3C is a cross-sectional view showing a state in the course of manufacture of the semiconductor laser according to the first embodiment of the present invention.

As shown in FIG. 3C, compound semiconductor layers 205 which are made of undoped InP are regrown from around the formed semiconductor layer 104a and active layer 103. The distribution Bragg reflecting mirror regions 132a and 132b each enter a state in which the compound semiconductor layer 205 is formed on the lower cladding layer 102.

Figure 3D:
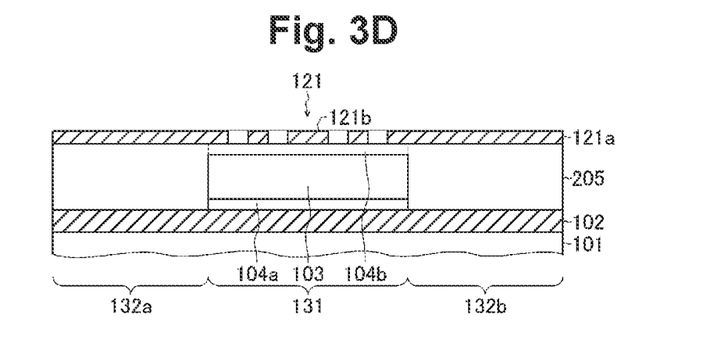
FIG. 3D is a cross-sectional view showing a state in the course of manufacture of the semiconductor laser according to the first embodiment of the present invention.

In the distributed feedback active region 131, the n-type semiconductor layer 105 and the p-type semiconductor layer 106 are formed by, for example, selectively introducing an n-type impurity and a p-type impurity into regions on two sides of the active layer 103 through ion implantation. This results in a state in which the semiconductor layer 104b that is made of non-doped InP is formed on the active layer 103. In this stage, the compound semiconductor layers 205 are left in the distribution Bragg reflecting mirror regions 132a and 132b that are across the distributed feedback active region 131 from each other.

The diffraction grating layer 121a that is made of SiN is then formed on the semiconductor layer 1o4b and the compound semiconductor layers 205, and the first diffraction grating 121 is formed at the diffraction grating layer 121a in the distributed feedback active region 131. The diffraction grating layer 121a is formed by, for example, depositing SiN by a well-known deposition method. The first diffraction grating 121 is then formed by a publicly known lithographic technique and a publicly known etching technique. In this formation, each diffraction grating recessed portion extends through the diffraction grating layer 121a.

Since the semiconductor layer 104b and the compound semiconductor layers 205 underlying the diffraction grating layer 121a are composed of InP, and the diffraction grating layer 121a is composed of SiN, InP is little etched in etching in patterning of the diffraction grating layer 121a, and the semiconductor layer 104b functions as an etch stop layer. For this reason, there is no need for accurate control of an etching amount in the formation of recessed portions extending through the diffraction grating layer 121a.

Figure 3E:
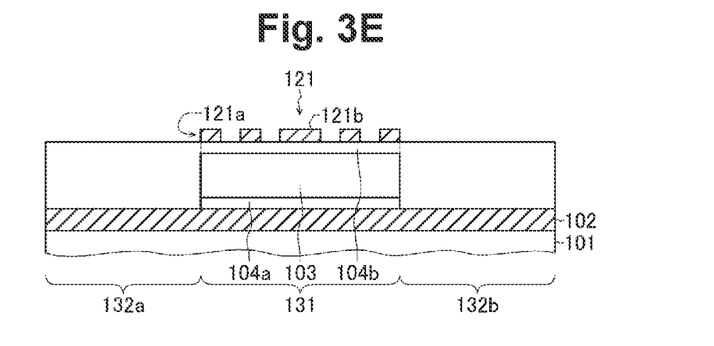
FIG. 3E is a cross-sectional view showing a state in the course of manufacture of the semiconductor laser according to the first embodiment of the present invention.

After a mask pattern used to form the first diffraction grating 121 is removed, the diffraction grating layer 121a is etched using a mask pattern which covers a region of the distributed feedback active region 131. This produces a state in which the diffraction grating layer 121a is formed only in the distributed feedback active region 131, as shown in FIG. 3E. Note that FIG. 3E shows a state after the mask pattern is removed.

After that, the second diffraction gratings 122a and 122b in the distribution Bragg reflecting mirror regions 132a and 132b are formed. The second diffraction gratings 122a and 122b may be formed by, for example, patterning the compound semiconductor layers 205 in the distribution Bragg reflecting mirror regions 132a and 132b by predetermined etching using, as a mask, a resist pattern formed by a well-known lithographic technique. Note that the core layers 113a and 113b are not formed in this stage.

The core layers 113a and 113b are formed in portions, in which the second diffraction gratings 122a and 122b are formed, by patterning the compound semiconductor layers 205 in regions which are across the distributed feedback active region 131 from each other in the wave-guiding direction in the same manner as described earlier. According to this configuration, since the core layers 113a and 113b in the distribution Bragg reflecting mirror regions 132a and 132b are formed from the compound semiconductor layers 205 used to form the n-type semiconductor layer 105 and the p-type semiconductor layer 1o6 for current injection, steps can be simplified. After that, the n-type electrode 107 is formed on the n-type semiconductor layer 105, and the p-type electrode 108 is formed on the p-type semiconductor layer 106.

Figure 4A:
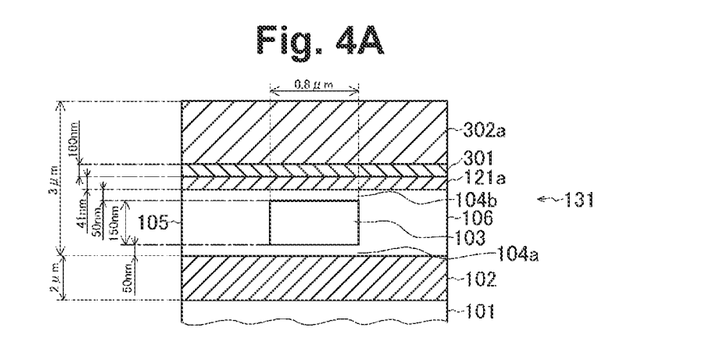
FIG. 4A is a cross-sectional view showing a configuration of a portion of a different semiconductor laser according to the first embodiment of the present invention.
Figure 4B:
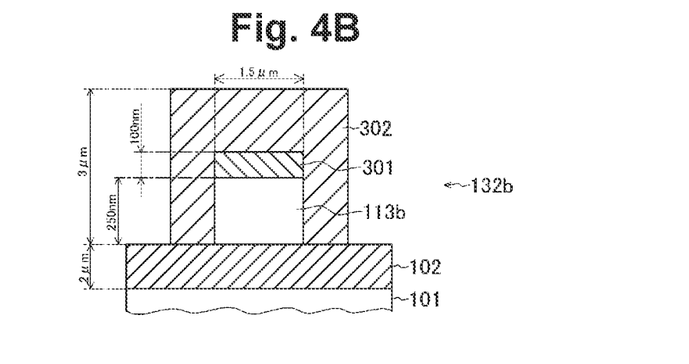
FIG. 4B is a cross-sectional view showing a configuration of a portion of the different semiconductor laser according to the first embodiment of the present invention.
Figure 4C:
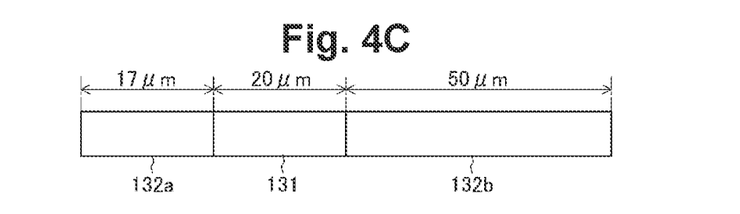
FIG. 4C is a configuration view showing a configuration of a portion of the semiconductor laser according to the first embodiment of the present invention.

For example, if the active layer 103 shown in FIG. 4A that is made of InGaAsP, has a thickness of 150 nm, and has a quantum well structure, in which nine layers of quantum wells are stacked, is used, the distribution Bragg reflecting mirror region 132a that has a wave-guide length of 17 μm may be provided on one side of the distributed feedback active region 131 that is set to have a wave-guide length of 20 μm, and the distribution Bragg reflecting mirror region 132b that has a wave-guide length of 50 μm may be provided on the other side, as shown in FIG. 4C. With this configuration, a lasing threshold gain is 46 cm$^{-1}$, and a short laser with an active layer length of 20 μm can be oscillated.

As shown in FIG. 4B, a spot-size converter core 302 made of $SiO_x$ that is higher in silicon than stoichiometric composition is provided in the distribution Bragg reflecting mirror region 132b. The spot-size converter core 302 is formed above the core layer 113b with an $SiO_2$ layer 301 between the spot-size converter core 302 and the core layer 113b. In the distributed feedback active region 131, the $SiO_2$ layer 301 is formed to extend from the distribution Bragg reflecting mirror region 132b, and an $SiO_x$ layer 302a which constitutes the spot-size converter core 302 is formed. Dimensions are as shown in FIGS. 4A and 4B.

A diffraction grating in the distributed feedback active region 131 is formed at the diffraction grating layer 121a that has a thickness of 41 nm (a coupling coefficient of 145 cm$^{-1}$). In the distribution Bragg reflecting mirror regions 132a and 132b, diffraction gratings are formed by forming recessed portions having a depth of 25 nm in upper surfaces of the core layers 113a and 113b that are made of InP (coupling coefficients of 868 cm$^{-1}$).

According to the above-described first embodiment, a lasing wavelength error due to an error in production of a diffraction grating can be reduced. In a laser having a diffraction grating, such as a DFB laser, a lasing wavelength is determined by a coupling coefficient of the diffraction grating. Since the coupling coefficient of the diffraction grating depends on an etching depth for a semiconductor, control of a depth of the diffraction grating is important for lasing wavelength control. However, if a diffraction grating is formed by subjecting a compound semiconductor layer which constitutes the distributed feedback active region 131 to etching processing (e.g., if the semiconductor layer 104a is subjected to etching processing), control of the amount of the etching is not easy, and control of a depth of the diffraction grating is not easy.

To cope with the above-described problem, according to the embodiment, a diffraction grating (the first diffraction grating 121) is formed from recessed portions made to extend through the diffraction grating layer 121a, and a depth of the diffraction grating is determined by a thickness of the diffraction grating layer 121a. Thus, according to the embodiment, the diffraction grating layer 121a may be formed to a thickness equal to a desired depth of the diffraction grating. Generally, control of a thickness of a film to be formed can more easily achieve high precision than control of an etching amount. For example, if a well-known ECR sputtering method is used, the thickness of the diffraction grating layer 121a can be controlled on the order of 1 nm. For this reason, the embodiment can reduce a lasing wavelength error due to an error in production of a diffraction grating.

Note that, if a diffraction grating is constructed from a dielectric substance, a coupling coefficient cannot be made so high, which reduces reflectivity and increases a threshold gain. For this reason, total reflectivity is increased by constructing the second diffraction gratings 122a and 122b from a compound semiconductor, in the distribution Bragg reflecting mirror regions 132a and 132b. This makes it possible to reduce a lasing wavelength error due to an error in production of a diffraction grating without increasing a laser threshold gain.

For example, in the case of a configuration in which the 20 μm distribution Bragg reflecting mirror region 132a is arranged on one side of the distributed feedback active region 131 with a wave-guide length of 10 μm and the 50-μm distribution Bragg reflecting mirror region 132b is arranged on the other side, if a diffraction grating is formed at a compound semiconductor layer in each of the distributed feedback active region 131 and the distribution Bragg reflecting mirror regions 132a and 132b, a depth needs to be set to 25 nm to achieve a lasing threshold gain of 50 cm$^{-1}$.

Figure 5:
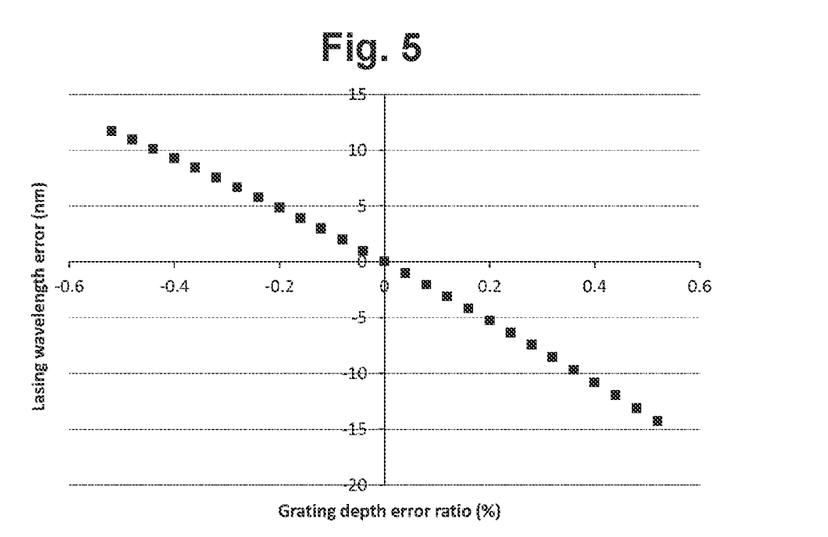
FIG. 5 is a characteristic diagram showing a relationship between an error in a depth of a diffraction grating and an error in a lasing wavelength.

As shown in FIG. 5, if an error in diffraction grating depth is 20% (an actual value is 20 nm or 30 nm with respect to a design value of 25 nm), an error in lasing wavelength is 5 nm. Thickness control in film formation is higher in precision than etching amount control and can perform control on the order of 1 nm, and an error in lasing wavelength is reduced to about 1 nm. Note that a result shown in FIG. 5 is a result of a simulation based on the dimensions shown in FIGS. 4A and 4B.

Figure 6:
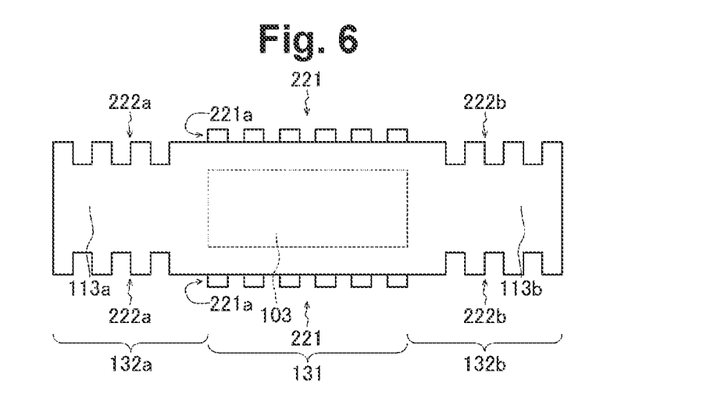
FIG. 6 is a plan view showing a configuration of a different semiconductor laser according to the first embodiment of the present invention.

Note that first diffraction gratings 221 may be formed lateral to the active layer 103 in the distributed feedback active region 131 and that second diffraction gratings 222a and 222b may be formed lateral to the core layers 113a and 113b in the distribution Bragg reflecting mirror regions 132a and 132b, as shown in a plan view of FIG. 6. Even in this case, the first diffraction grating 221 may be constructed from recessed portions which are formed to extend through diffraction grating layers 221a which are formed lateral to the active layer 103 and projection portions which are adjacent to the recessed portions. Even this configuration is the same as in the embodiment described earlier.

Figure 7:
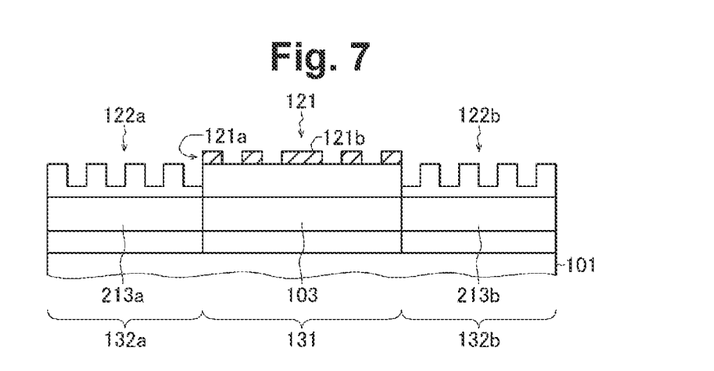
FIG. 7 is a cross-sectional view showing a configuration of a semiconductor layer according to the first embodiment of the present invention.

As shown in FIG. 7, core layers 213a and 213b which are made of InGaAsP may be formed in the distribution Bragg reflecting mirror regions 132a and 132b to serve as butt-joint buried waveguides. Semiconductor layers which are made of InP or the like are arranged on and underneath each of the core layers 213a and 213b and serve as cladding layers. With this configuration, equivalent refractive indexes of the distributed feedback active region 131 and the distribution Bragg reflecting mirror regions 132a and 132b coincide, and the effect of reducing a loss due to reflection can be achieved, in addition to the effects of the embodiment described earlier. Note that a diffraction grating may be provided lateral to each region.

Second Embodiment

Figure 8:
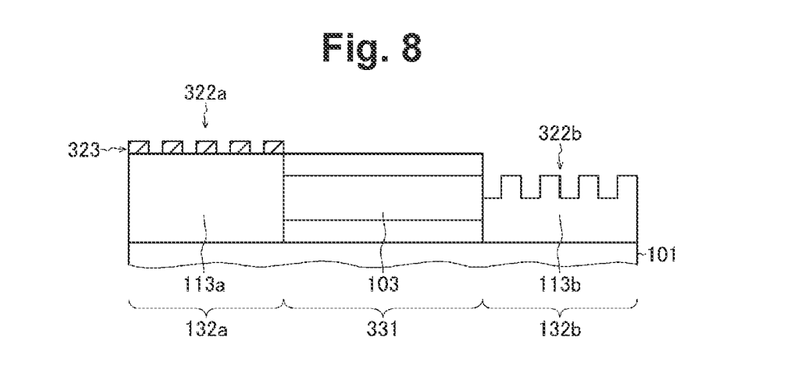
FIG. 8 is a cross-sectional view showing a configuration of a semiconductor layer according to a second embodiment of the present invention.

A semiconductor laser according to a second embodiment of the present invention will be described with reference to FIG. 8. The semiconductor laser includes an active region 331 and two distribution Bragg reflecting mirror regions 132a and 132b which are arranged to be continuous with the active region 331. The distribution Bragg reflecting mirror regions 132a and 132b are arranged across the active region 331 from each other in a wave-guiding direction to be continuous with the active region 331.

The active region 331 has an active layer 103 which is made of a compound semiconductor. The distribution Bragg reflecting mirror regions 132a and 132b have two core layers 113a and 113b which are made of a compound semiconductor and diffraction gratings 322a and 322b which are formed to correspond to the respective core layers 113a and 113b. The core layers 113a and 113b are formed across the active layer 103 from each other in the wave-guiding direction to be continuous with the active layer 103.

The diffraction grating 322a is composed of recessed portions which are formed to extend through a diffraction grating layer 323 which is formed on the core layer 113a and projection portions which are adjacent to the recessed portions. Note that, in the second embodiment, the diffraction grating 322b is formed by, e.g., patterning a semiconductor layer on an upper surface of the core layer 113b or a semiconductor layer which is information of the core layer 113b by a publicly known lithographic technique and a publicly known etching technique.

The diffraction grating layer 323 is composed of a material which is more resistant to etching than a constituent material for the distribution Bragg reflecting mirror region 132a. The diffraction grating layer 323 may be composed of a material with a lower refractive index than that of the constituent material for the distribution Bragg reflecting mirror region 132a. For example, the diffraction grating layer 323 may be composed of a dielectric substance, such as SiN, SiO$_x$N$_y$, SiO$_2$, Al$_2$O$_3$, or HfO$_2$.

As for the semiconductor laser according to the second embodiment, in the distribution Bragg reflecting mirror region 132a connected to one side of the active region 331, a coupling coefficient of the diffraction grating 322a is low, and a stop band is narrow. In contrast, in the distribution Bragg reflecting mirror region 132b connected to the other side of the active region 331, a coupling coefficient of the diffraction grating 322b is high, and a stop band is wide. With this configuration, a lasing wavelength is determined by a Bragg wavelength of the diffraction grating 322a in the distribution Bragg reflecting mirror region 132a. As described in the aforementioned first embodiment, a diffraction grating depth of the diffraction grating 322a that is composed of recessed portions which are formed to extend through the diffraction grating layer 323 can be controlled with high precision, and a lasing wavelength error due to an error in diffraction grating depth can be reduced.

Third Embodiment

Figure 9:
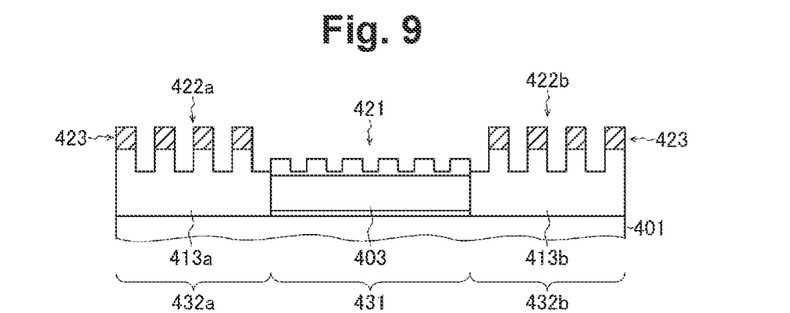
FIG. 9 is a cross-sectional view showing a configuration of a semiconductor layer according to a third embodiment of the present invention.

A semiconductor laser according to a third embodiment of the present invention will be described with reference to FIG. 9. The semiconductor laser includes a distributed feedback active region 431 and two distribution Bragg reflecting mirror regions 432a and 432b which are arranged to be continuous with the distributed feedback active region 431. The semiconductor laser is a so-called DR laser. The distribution Bragg reflecting mirror regions 432a and 432b are arranged across the distributed feedback active region 431 from each other in a wave-guiding direction to be continuous with the distributed feedback active region 431.

The distributed feedback active region 431 has an active layer 403 which is made of a compound semiconductor and a first diffraction grating 421. The distribution Bragg reflecting mirror regions 432a and 432b have two core layers 413a and 413b which are made of a compound semiconductor and second diffraction gratings 422a and 422b which are formed to correspond to the respective core layers 413a and 413b. The core layers 413a and 413b are formed across the active layer 403 from each other in the wave-guiding direction to be continuous with the active layer 403.

The second diffraction gratings 422a and 422b are composed of recessed portions which are formed to extend through diffraction grating layers 423 which are formed on the core layers 413a and 413b and extend from upper surfaces of the distribution Bragg reflecting mirror regions 432a and 432b to portions in a depth direction and projection portions which are adjacent to the recessed portions. The diffraction grating layer 423 is composed of a material which is more resistant to etching than constituent materials for the distribution Bragg reflecting mirror regions 432a and 432b. The diffraction grating layer 423 is composed of a material with a lower refractive index than those of the constituent materials for the distribution Bragg reflecting mirror regions 432a and 432b. The diffraction grating layer 423 may be composed of a dielectric substance, such as SiN, $SiO_xN_y$, $SiO_2$, $Al_2O_3$, or $HfO_2$.

Note that, in the third embodiment, the first diffraction grating 421 is formed by, e.g., patterning a semiconductor layer on an upper surface of the distributed feedback active region 431 by a publicly known lithographic technique and a publicly known etching technique.

According to the third embodiment with the above-described configuration, the second diffraction gratings 422a and 422b including the diffraction grating layers 423 are deeper and have higher coupling coefficients. In contrast, a coupling coefficient is low in the first diffraction grating 421. As described above, since the coupling coefficients of the second diffraction gratings 422a and 422b are higher than that of the first diffraction grating 421, a rise in a lasing threshold gain of a laser due to a loss of a diffraction grating can be curbed. Note that a diffraction grating may be provided lateral to each region.

Note that the present invention is not limited to the embodiments described above and that it is apparent to those skilled in the art that many modifications and combinations can be made within the technical idea of the present invention.

REFERENCE SIGNS LIST

101 Substrate
102 Lower cladding layer
103 Active layer
104a Semiconductor layer
104b Semiconductor layer
105 N-type semiconductor layer
106 P-type semiconductor layer
107 N-type electrode
108 P-type electrode
113a, 113b Core layer
121 First diffraction grating
121a Diffraction grating layer
121b Phase shift unit
122a, 122b Second diffraction grating
131 Distributed feedback active region
132a, 132b Distribution Bragg reflecting mirror region

The invention claimed is:

1. A semiconductor laser comprising:
a distributed feedback active region comprising an active layer made of a compound semiconductor on a substrate and a first diffraction grating;
a first distribution Bragg reflecting mirror region comprising:
a first core layer on a first side of the active layer and continuous with the active layer, wherein the first core layer comprises a compound semiconductor; and
a second diffraction grating corresponding to the first core layer, the second diffraction grating being on a first side of the distributed feedback active region and continuous with the distributed feedback active region; and
a second distribution Bragg reflecting mirror region comprising:
a second core layer on a second side of the active layer and continuous with the active layer, the second side of the active layer being opposite the first side of the active layer in a wave-guiding direction, wherein the second core layer comprises a compound semiconductor; and
a third diffraction grating corresponding to the second core layer, the third diffraction grating being on a second side of and continuous with the distributed feedback active region, the second side of the distributed feedback active region being opposite the first side of the distributed feedback active region in the wave-guiding direction,
wherein the first diffraction grating comprises a recessed portion extending through a diffraction grating layer on the active layer and a projection portion adjacent to the recessed portion, and
wherein the diffraction grating layer comprises a material that is more resistant to etching than a constituent material for the distributed feedback active region.

2. The semiconductor laser according to claim 1, wherein the diffraction grating layer comprises a material with a lower refractive index than a refractive index of the constituent material for the distributed feedback active region.

3. The semiconductor laser according to claim 1, wherein:
the first diffraction grating is lateral to the active layer; and
the second and the third diffraction gratings are lateral to the first and the second core layers.

4. The semiconductor laser according to claim 3, wherein the diffraction grating layer comprises a dielectric material.

5. The semiconductor laser according to claim 1, wherein the distributed feedback active region comprises:
an n-type semiconductor layer in contact with a first side surface of the active layer;

a p-type semiconductor layer in contact with a second side surface of the active layer opposite the first side surface;

an n-type electrode electrically connected to the n-type semiconductor layer; and a p-type electrode electrically connected to the p-type semiconductor layer.

6. A method for manufacturing a semiconductor laser, the method comprising:

forming a distributed feedback active region comprising an active layer made of a compound semiconductor formed on a substrate and a first diffraction grating;

forming a first distribution Bragg reflecting mirror region comprising:

forming a first core layer on a first side of the active layer and continuous with the active layer, wherein the first core layer comprises a compound semiconductor; and forming a second diffraction grating corresponding to the first core layer, the second diffraction grating being on a first side of the distributed feedback active region and continuous with the distributed feedback active region; and forming a second distribution Bragg reflecting mirror region comprising:

forming a second core layer on a second side of the active layer and continuous with the active layer, the second side of the active layer being opposite the first side of the active layer in a wave-guiding direction, wherein the second core layer comprises a compound semiconductor; and forming a third diffraction grating corresponding to the second core layer, the third diffraction grating being on a second side of and continuous with the distributed feedback active region, the second side of the distributed feedback active region being opposite the first side of the distributed feedback active region in the wave-guiding direction, wherein the first diffraction grating comprises a recessed portion extending through a diffraction grating layer formed on the active layer and a projection portion adjacent to the recessed portion, and wherein the diffraction grating layer comprises a material that is more resistant to etching than a constituent material for the distributed feedback active region.

7. The method according to claim 6, wherein the diffraction grating layer comprises a material with a lower refractive index than a refractive index of the constituent material for the distributed feedback active region.

8. The method according to claim 6, further comprising:

forming the first diffraction grating lateral to the active layer; and forming the second and the third diffraction gratings lateral to the first and the second core layers.

9. The method according to claim 8, wherein the diffraction grating layer comprises a dielectric material.

10. The method according to claim 6, wherein forming the distributed feedback active region comprises:

forming an n-type semiconductor layer in contact with a first side surface of the active layer;

forming a p-type semiconductor layer in contact with a second side surface of the active layer opposite the first side surface;

forming an n-type electrode electrically connected to the n-type semiconductor layer; and forming a p-type electrode electrically connected to the p-type semiconductor layer.

* * * * *